(12) United States Patent  (10) Patent No.: US 8,501,631 B2
Valcore, Jr. et al.  (45) Date of Patent: Aug. 6, 2013

(54) PLASMA PROCESSING SYSTEM CONTROL BASED ON RF VOLTAGE

(75) Inventors: John C. Valcore, Jr., San Jose, CA (US); Henry S. Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 5 days.

(21) Appl. No.: 12/962,524

(22) Filed: Dec. 7, 2010

(65) Prior Publication Data

US 2011/0137446 A1 Jun. 9, 2011

Related U.S. Application Data

(63) Continuation-in-part of application No. 12/950,710, filed on Nov. 19, 2010.

(60) Provisional application No. 61/303,628, filed on Feb. 11, 2010, provisional application No. 61/262,886, filed on Nov. 19, 2009.

(51) Int. Cl.
*H01L 21/00* (2006.01)
*H01L 21/36* (2006.01)
*H01L 21/42* (2006.01)
*H01L 21/461* (2006.01)
*H01L 21/302* (2006.01)

(52) U.S. Cl.
USPC .......... 438/729; 438/9; 438/10; 438/485; 438/513; 438/788; 257/E21.143; 257/E21.218; 257/E21.311

(58) Field of Classification Search
USPC ............ 257/E21.143, E21.218, E21.311; 118/723 E
See application file for complete search history.

(56) References Cited

U.S. PATENT DOCUMENTS

| | | | |
|---|---|---|---|
| 5,474,648 A | 12/1995 | Patrick et al. | |
| 5,737,177 A | 4/1998 | Mett et al. | |
| 5,764,471 A | 6/1998 | Burkhart | |
| 5,812,361 A | 9/1998 | Jones et al. | |
| 5,894,400 A | 4/1999 | Graven et al. | |
| 5,980,767 A | 11/1999 | Koshimizu et al. | |
| 6,198,616 B1 | 3/2001 | Dahimene et al. | |
| 6,522,121 B2 * | 2/2003 | Coumou | 324/76.19 |
| 6,535,785 B2 | 3/2003 | Johnson et al. | |

(Continued)

FOREIGN PATENT DOCUMENTS

JP 2001-127045 5/2001
JP 2004-3355921 11/2004

(Continued)

OTHER PUBLICATIONS

U.S. Appl. No. 61/262,886, filed Nov. 19, 2009.

(Continued)

*Primary Examiner* — Mohsen Ahmadi
(74) *Attorney, Agent, or Firm* — IPSG, P.C. Intellectual Property Law

(57) ABSTRACT

A method for controlling a plasma processing system using wafer bias information derived from RF voltage information is proposed. The RF voltage is processed via an analog or digital methodology to obtain peak voltage information at least for each of the fundamental frequencies and the broadband frequency. The peak voltage information is then employed to derive the wafer bias information to serve as a feedback or control signal to hardware/software of the plasma processing system.

20 Claims, 13 Drawing Sheets

U.S. PATENT DOCUMENTS

| | | | |
|---|---|---|---|
| 6,677,246 | B2 | 1/2004 | Scanlan et al. |
| 7,169,625 | B2 | 1/2007 | Davis |
| 7,359,177 | B2 * | 4/2008 | Yang et al. .................... 361/234 |
| 7,505,879 | B2 | 3/2009 | Tomoyasu et al. |
| 7,626,544 | B2 * | 12/2009 | Smith et al. .................. 342/386 |
| 7,728,602 | B2 * | 6/2010 | Valcore et al. ................ 324/536 |
| 7,768,269 | B2 | 8/2010 | Pipitone et al. |
| 2003/0082835 | A1 | 5/2003 | McChesney et al. |
| 2003/0103793 | A1 * | 6/2003 | Murakoshi et al. ........... 400/621 |
| 2004/0028837 | A1 | 2/2004 | Fink |
| 2004/0060660 | A1 * | 4/2004 | Klimecky et al. ........ 156/345.28 |
| 2004/0087047 | A1 * | 5/2004 | Jaiswal et al. ................. 438/17 |
| 2004/0135590 | A1 | 7/2004 | Quon |
| 2005/0252884 | A1 | 11/2005 | Lam et al. |
| 2007/0065594 | A1 | 3/2007 | Chiang et al. |
| 2009/0151871 | A1 | 6/2009 | Pease et al. |

FOREIGN PATENT DOCUMENTS

| | | |
|---|---|---|
| KR | 10-2005-0088438 | 9/2005 |
| KR | 10-2005-0089995 | 9/2005 |
| KR | 10-2007-0031915 | 3/2007 |
| WO | WO-2008-002938 | 1/2008 |

OTHER PUBLICATIONS

U.S. Appl. No. 61/303,628, filed Feb. 11, 2010.
U.S. Appl. No. 12/950,710, filed Nov. 19, 2010.
U.S. Appl. No. 12/907,859, filed Oct. 19, 2010.
"International Preliminary Report on Patentability", PCT Application Number: PCT/US2010/057478, Mailing Date: May 31, 2012.
"International Search Report", PCT Application Number: PCT/US2010/057450, Mailing Date: Jul. 18, 2011.
"Written Opinion", PCT Application Number: PCT/US2010/057450, Mailing Date: Jul. 18, 2011.
"International Search Report", PCT Application Number: PCT/US2010/057478, Mailing Date: Jul. 26, 2011.
"Written Opinion", PCT Application Number: PCT/US2010/057478, Mailing Date: Jul. 26, 2011.
"International Search Report", PCT Application No. PCT/US2011/063422, Mailing Date: Mar. 28, 2012.
"Written Opinion", PCT Application No. PCT/US2011/063422, Mailing Date: Mar. 28, 2012.
"Non Final Office Action", U.S. Appl. No. 12/950,710, Mailing Date: Oct. 12, 2012.
"Non Final Office Action", U.S. Appl. No. 12/907,859, Mailing Date: Dec. 12, 2012.
"Final Office Action", U.S. Appl. No. 12/950,710, Mailing Date: Feb. 6, 2013.

* cited by examiner

How are the 2 methods Different?

- Initial Method Utilizes MVA [multivariate analysis] to create a LINEAR Transfer Function
  - PLS (partial least squares) implemented for each state space to create linear transfer function [RF Voltage to Wafer Bias]
- Current Method Utilizes Non-Linear Transfer Function [power equation]
  - Power Equation used based on existing Physical Relationship of RF Power to RF Voltage
    - Voltage = sqrt( Power / R )
    - This can be rewritten to $V = a * (Power/|Z|)^b + c$
      - In Theory, $a = 1$, $b = .5$, and $c = 0$
  - Impedance of the Plasma is a Function of RF Power Delivered *as well as* Process Parameter [Chemistry, Pressure, Flow, Chamber Coupling (Capacitive/Inductive)]
  - First Order Approximation, $V\_wafer\_dc = V\_rf$
- For a given Frequency, Explicit Power Equation Can be Used to Relate RF Voltage to Wafer DC Voltage
  - $V\_wafer\_dc = a * V\_rf^b + c$
    - Coefficients a, b, c are optimized to cover entire operating range of Plasma impedance for a given Frequency

FIGURE 8

Further Details

- 7 state spaces exist
  - For single frequency, single equation exists ($V\_wafer\_dc = a * Vpp ^ b + c$)
    - Coefficient {a} is bounded by [.3 3]
    - Coefficient {b} is bounded by [.5 and 1] (can never be greater than one)
    - Coefficient {c} is typically 0. (more or less compensate for measurement inaccuracy)
  - For multi frequency state
    - Each Frequency's contribution is computed based upon Single Frequency Transfer Function
    - Individual Frequency's contributions are Summed together
    - Final Result, $V\_wafer\_dc = a * V\_summation ^ b + c$
      - Coefficients {a, b, c} have same bounds

- WHY Does this work?
  - Revisiting $V = sqrt(Power / |Z|)$, and first order approximation $V\_wafer\_dc = V\_rf$
  - Coefficient {a} is a function of Plasma Impedance
  - Coefficient {b} is a function of RF Voltage Peak Detection Method
  - Coefficient {c} is a function of calibration

FIGURE 9

Further Details

- In theory, you could simply have one power equation

- $V\_wafer\_dc = a * (Sum(RF\_Pwr\_2MHz/|Z2MHz| + RF\_Pwr\_27MHz/|Z27Mhz| + RF\_Pwr\_60MHz/|Z60MHz|))^b + c$

- Coefficients {a,b,c} where optimized to account for accuracy/precision of Delivered Power and Plasma Impedance Measurements

FIGURE 10

PLASMA PROCESSING SYSTEM CONTROL BASED ON RF VOLTAGE

PRIORITY CLAIM

This application is a continuation-in-part of an earlier filed patent application entitled "METHODS AND APPARATUS FOR CONTROLLING A PLASMA PROCESSING SYSTEM", filed on Nov. 19, 2010 (application Ser. No. 12/950,710), which claims priority under 35 USC. 119(e) to a commonly-owned provisional patent application entitled "BIAS COMPENSATION APPARATUS AND METHODS THEREFOR", U.S. Application No. 61/303,628, filed on Feb. 11, 2010 by John Valcore, Jr. and a commonly-owned provisional patent application entitled "METHOD AND DEVICE FOR COMPENSATING WAFER BIAS IN A RF DRIVEN PLASMA CHAMBER", U.S. Application No. 61/262,886, filed on Nov. 19, 2009 by John Valcore, Jr., both of which are incorporated herein by reference.

BACKGROUND OF THE INVENTION

In the semiconductor industry, the use of RF driven plasma chambers for manufacturing silicon wafers is commonplace. There exists a common need within such applications to monitor the sheath voltage, and specifically how the sheath voltage relates to the DC bias potential of the wafer itself.

Currently, there are several techniques to ascertain wafer potential, as well as sheath and bulk plasma potential. With respect to the wafer DC bias potential, one Monitoring method includes measuring the self-bias voltage of the wafer by detecting the leakage current between the wafer and the electrostatic chuck (ESC) while varying an applied DC voltage to the ESC. While this technique is used within some current production settings, the computed value is highly dependent upon the magnitude of the leakage current, which is coupled to the type of ESC in the system. The method of detecting leakage current through the wafer to the ESC is also highly dependent upon different types of backside wafer films.

Another method for ascertaining the wafer bias potential is through the use of silicon carbide pins attached to the outer edge of the ESC and in contact with the plasma. However such pins are consumables and have to be replaced frequently within production environments.

A third method for detecting the DC bias on the wafer is through a RF voltage probe at the ESC and a signal processing unit which computes the wafer voltage from the peak to peak RF voltage. This method provides a means for detecting the wafer DC bias voltage without a probe in direct contact with the plasma by scaling the RF voltage at the ESC to a DC value through the use of a calibrated gain and offset. This method assumes a purely linear relationship to the RF peak to peak voltage and the DC potential of the wafer which is not the case for multi-frequency plasmas. FIG. 1 shows the correlation of wafer bias to RF Vpp. In FIG. 1, when a linear fit is applied, the R-squared value is significantly less than one [e.g., R-sq: 0.90].

BRIEF DESCRIPTION OF THE DRAWINGS

The present invention is illustrated by way of example, and not by way of limitation, in the figures of the accompanying drawings and in which like reference numerals refer to similar elements and in which:

FIGS. 6-10 discuss the high impedance RF voltage probe for computing wafer potential based on frequency dependent RF voltage signals.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
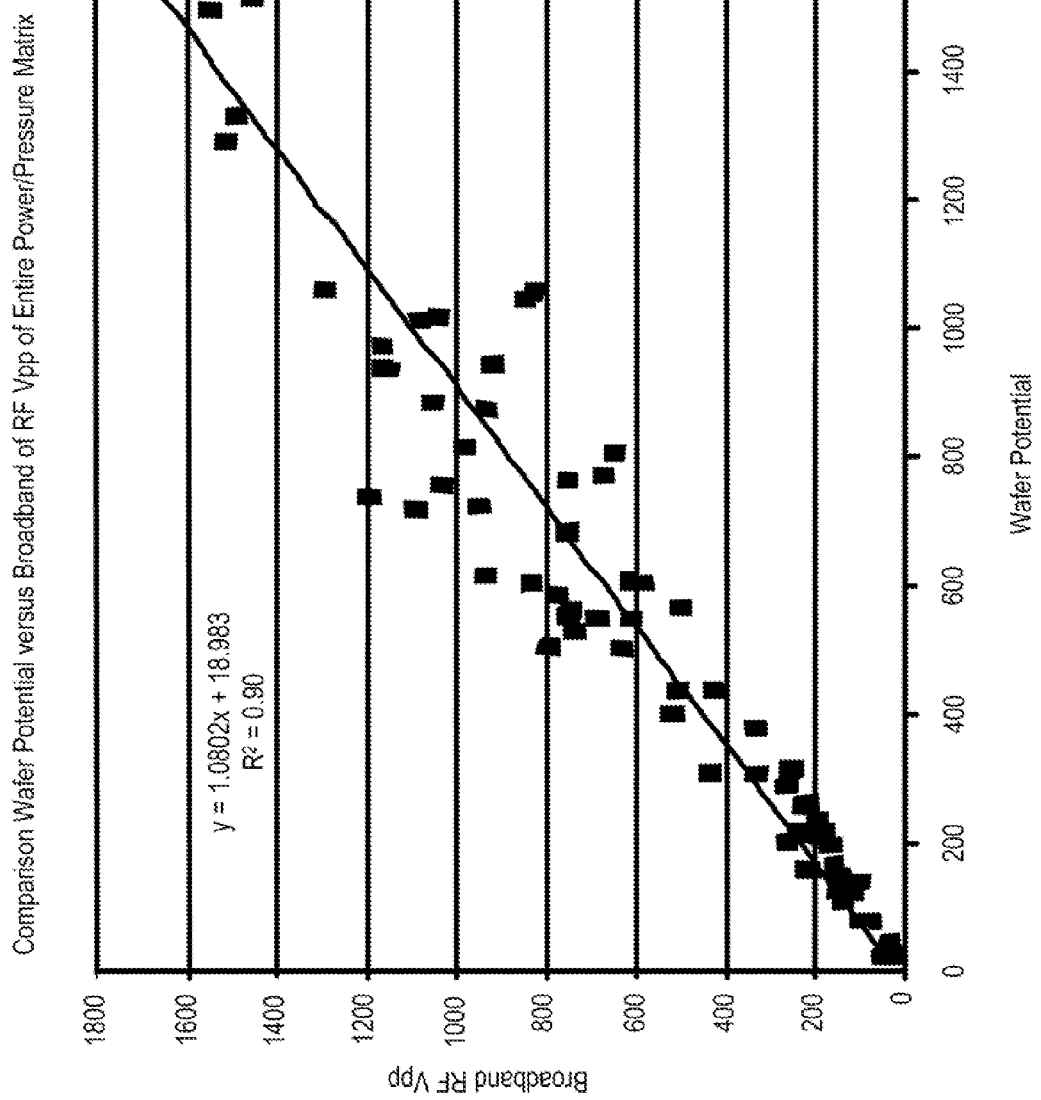
FIG. 1 shows the correlation of wafer bias to RF Vpp.
Figure 2:
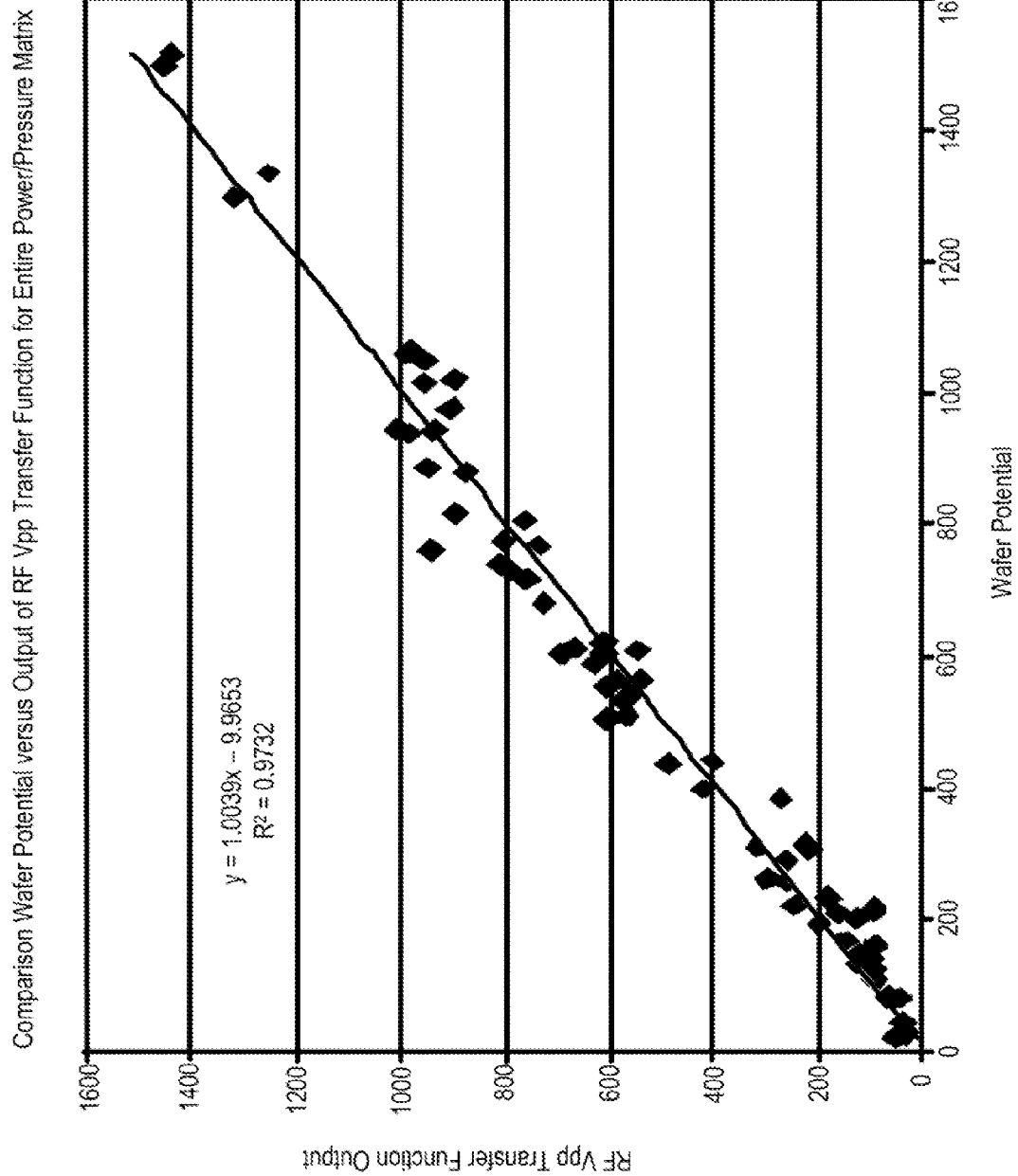
FIG. 2 shows the correlation of the wafer bias to the output of the disclosed RF voltage transfer function, with an R-squared value significantly closer to one.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples Embodiments of the disclosed invention will provide the end user the ability to measure the wafer bias potential by appropriately filtering and conditioning the RF voltage at the ESC and utilizing a transfer function that accounts for contribution of multiple RF frequencies in biasing the wafer. FIG. 2 shows the correlation of the wafer bias to the output of the disclosed RF voltage transfer function, with an R-squared value significantly closer to one [e.g., R-sq: 0.97].

This invention was conceived while attempting to improve an existing method of measuring DC bias Potential with a silicon carbide pin. The wear rate of this pin as well as the quartz insulating material which housed the pin was found to be a limiting factor for production throughput. It has been determined that although a non-linear relationship existed between the RF voltage and wafer potential in a multi-frequency plasma, a transfer function could be used to derive wafer potential based upon the contribution of each individual frequency driving the plasma.

Figure 3:
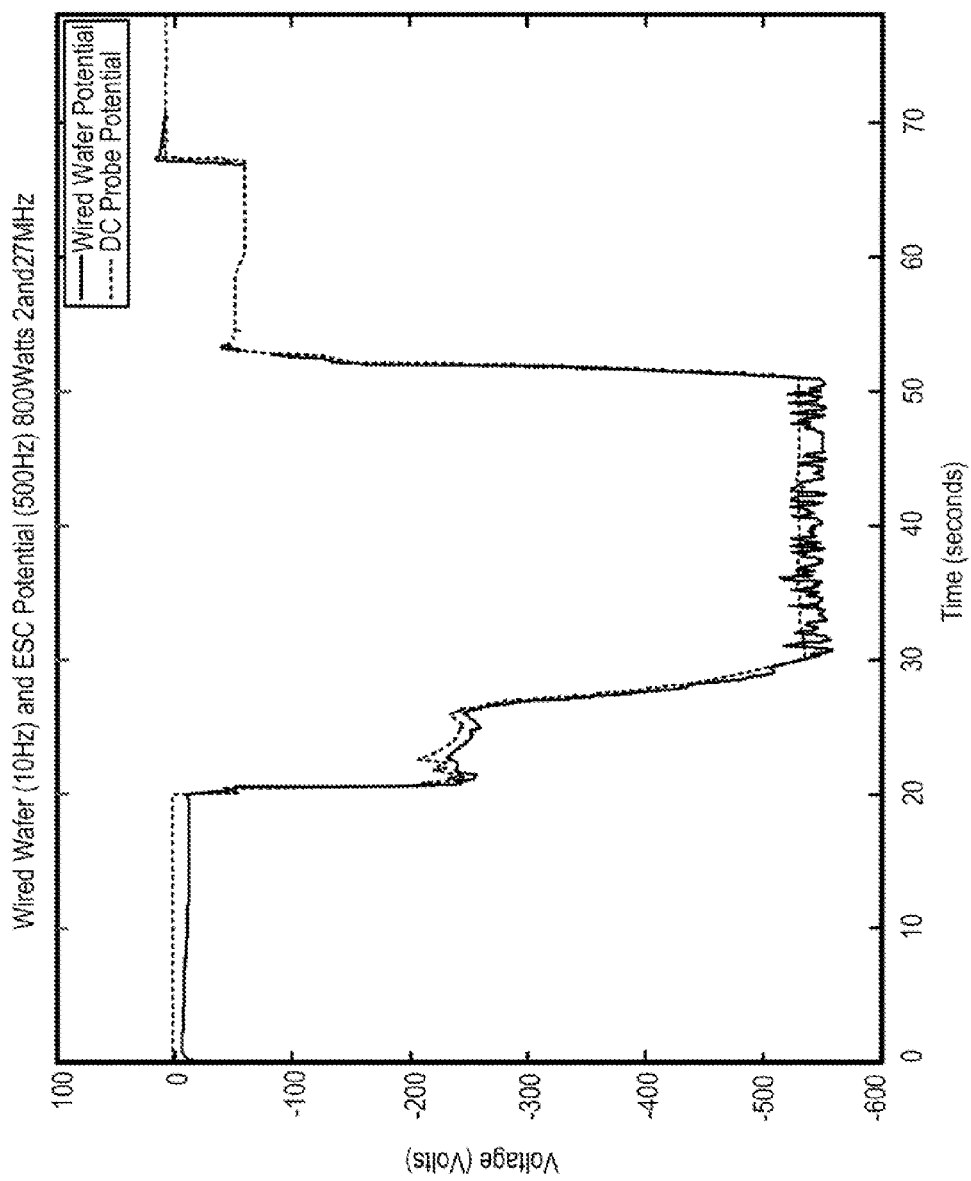
FIG. 3 depicts testing confirming the relationship between the plasma potential as seen by a Si carbide pin and the wafer potential as measured by a wired wafer.

Testing has been done to confirm the relationship between the plasma potential as seen by a Si carbide pin and the wafer potential as measured by a wired wafer, depicted in FIG. 3. It is then shown that the disclosed transfer function was significantly correlated to the voltage signal seen by the existing Si carbide pin.

Figure 4:
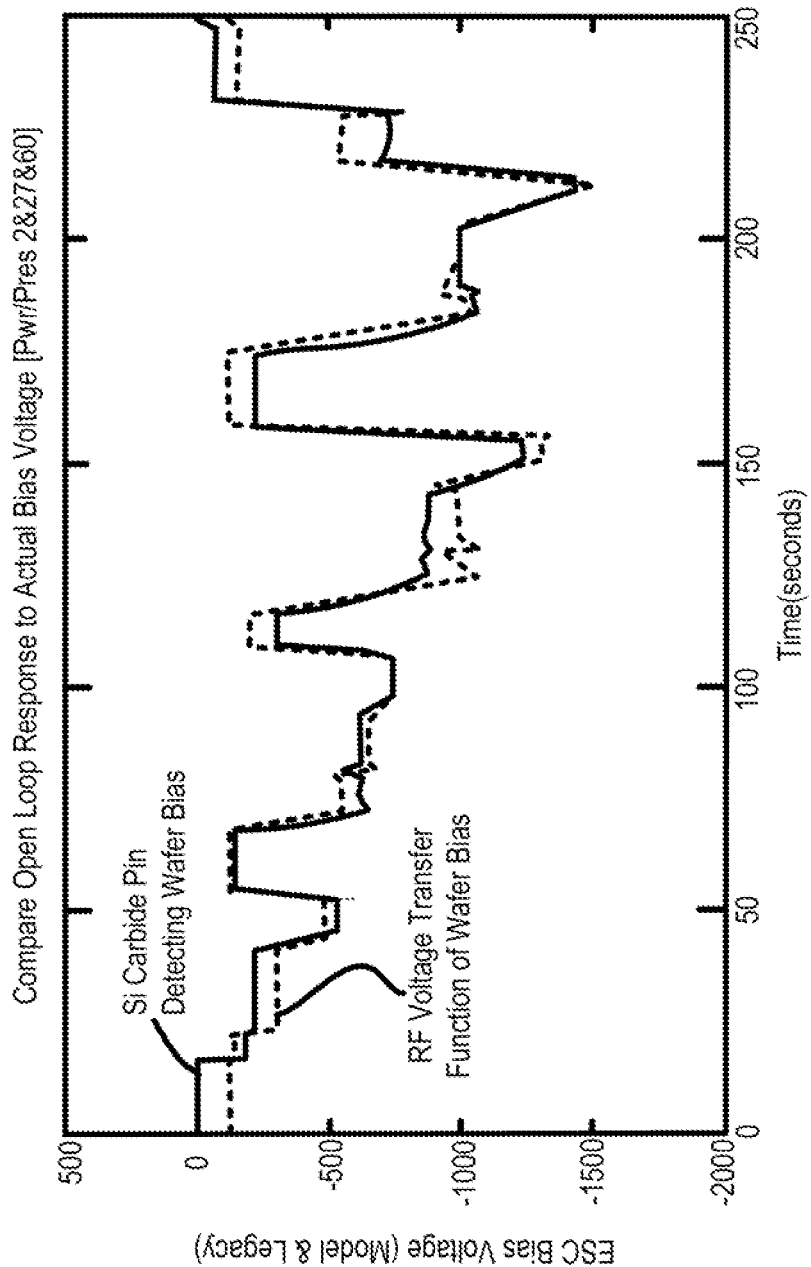
FIG. 4 shows the voltage seen by the Si HER (Hot Edge Ring) during a HARC (High Aspect Ratio Contact) process using 2 MHz, 27 MHz, and 60 MHz on a Lam DFC2300 Flex45 platform versus the voltage seen by Si carbide pin.

FIG. 4 shows the voltage seen by the Si HER (Hot Edge Ring) during a HARC (High Aspect Ratio Contact) process using 2 MHz, 27 MHz, and 60 MHz on a Lam DFC2300 Flex45 platform (available from Lam Research Corporation of Fremont, Calif.) versus the voltage seen by Si carbide pin. Given the aforementioned correlation of the Si carbide pin to the wired wafer, the commutative property provides credence to the statement that a transfer function involving individual RF voltages driving plasma is also a valid representation of the plasma sheath voltage at the wafer interface. In one or more embodiments, state-space analysis may be performed on the RF voltage to derive the transfer functions. State-space modeling is well-known and will not be elaborated here. In one or more embodiments, known transient handling techniques may be applied to improve robustness.

The features and advantages of embodiments of the invention may be better understood with reference to the figures and discussions that follow.

Figure 5A:
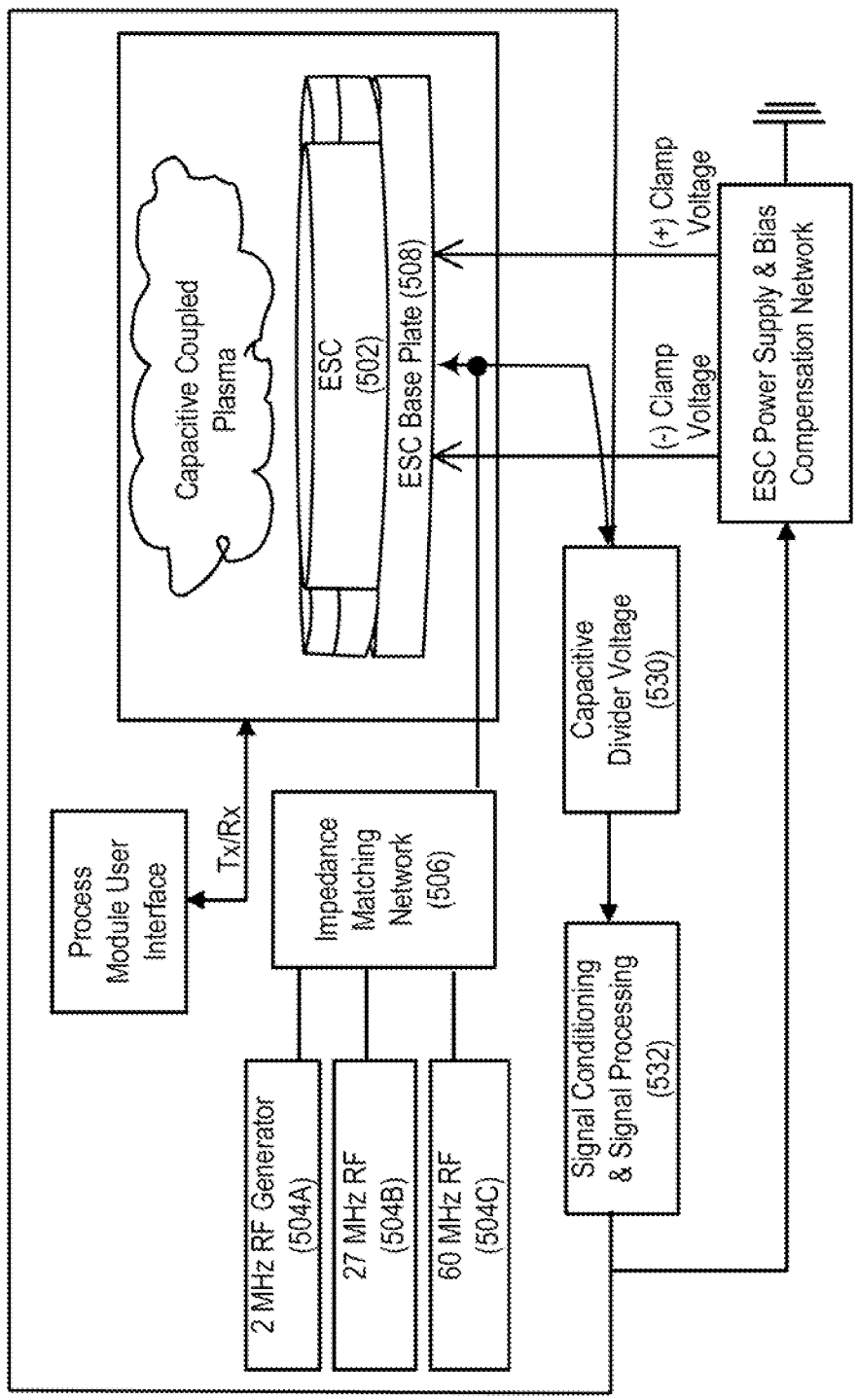
FIG. 5A depicts a system with a RF driven plasma that consists of an ESC power by three RF generators.

Generally speaking, the ability to indirectly measure the DC component of the plasma sheath potential within a RF driven plasma is dependent on a voltage probe connected to the RF rod in close proximity to the ESC. FIG. 5A depicts a system with a RF driven plasma that consists of an ESC 502 power by three RF generators 504A, 504B, and 504C via an impedance matching network 506. These RF generators provide different RF frequencies as shown although the number of frequencies employed, the exact frequencies employed as well as the number of RF generators employed may vary according to applications. An RF rod or another suitable RF sensing mechanism in close proximity (i.e., sufficiently close as to be able to sense the RF voltage) to base plate 508 (or another non-plasma exposing component associated with the ESC) provides a RF voltage to capacitive divider network 530. Capacity divider 530 will be discussed in greater details herein in connection with FIG. 5B. The output of capacitive divider network 530 is then provided to a signal conditioning and processing block 532, which will be discussed in greater details in connection with FIG. 5C herein below.

Figure 5B:
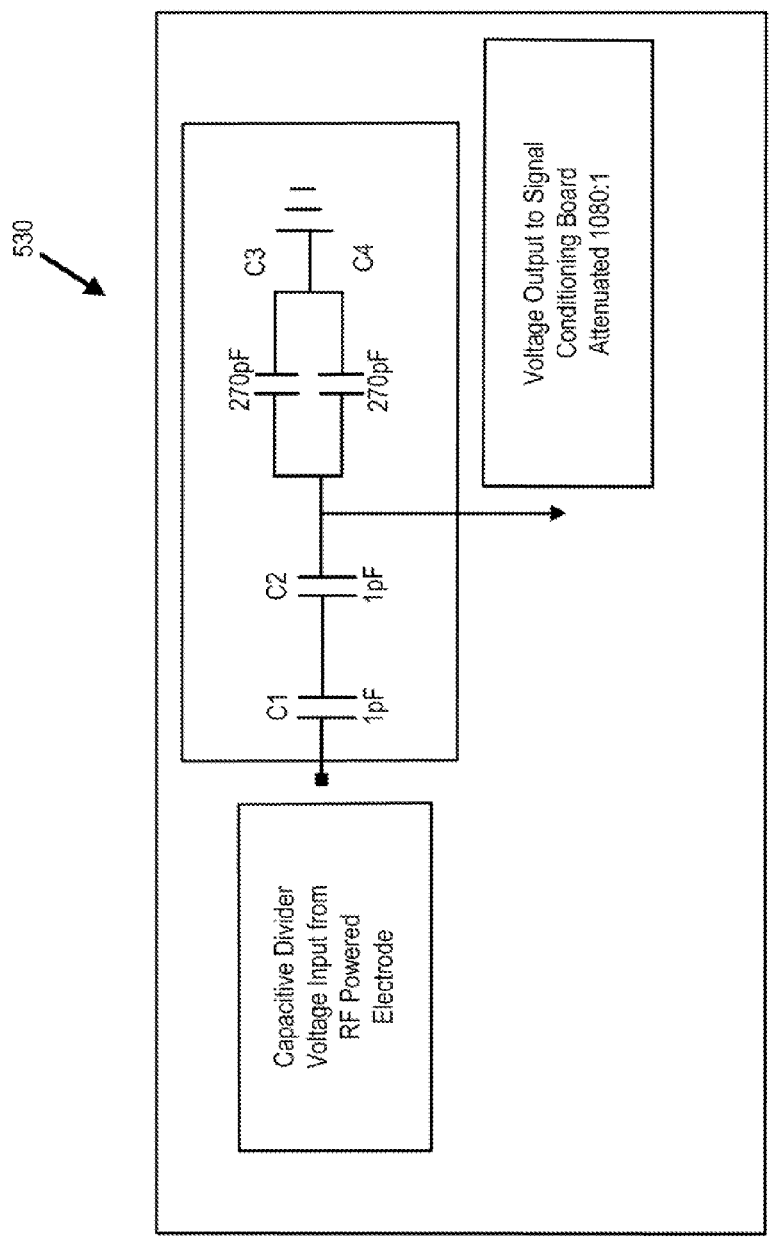
FIG. 5B illustrates an embodiment of the disclosed invention, where a voltage probe, consisting of a capacitive divider network, is attached to the RF rod in close proximity to the ESC base plate as well as a signal conditioning and signal processing apparatus.

FIG. 5B illustrates an example embodiment of the disclosed invention, where a voltage probe, including a capacitive divider network 530, is coupled to the RF rod (or another suitable RF sensing mechanism) in close proximity to the ESC base plate as well as coupled to a signal conditioning and signal processing apparatus. In the example of FIG. 5B, capacitor C1 is in series with capacitor C2, which is then in series with the parallel capacitors C3/C4. The voltage signal is obtained as shown in FIG. 5B. The capacitive divider voltage probe provides a high impedance path for the RF voltage to be sensed without unduly perturbing the RF power driving the plasma.

The specific make up of the capacitive divider is dependent upon the RF generators driving the plasma, with the highest frequency generator being the dominant factor. The capacitive divider also sufficiently attenuates the voltage signal by providing a low impedance path to ground in parallel with a 50-ohm coaxial cable responsible for carrying the voltage signal to the signal conditioning and signal processing apparatus. Note that these values are provided as example and for reference only and are not limiting. In the example of FIG. 5B the input impedance is significantly high [$Z=1/(\omega*C)$, when $\omega=60$ MHz, $C=0.5$ pF then $Z\sim33$ Kohms] and the impedance to ground is low (~31 ohms @ 60 Mhz).

Figure 5C:
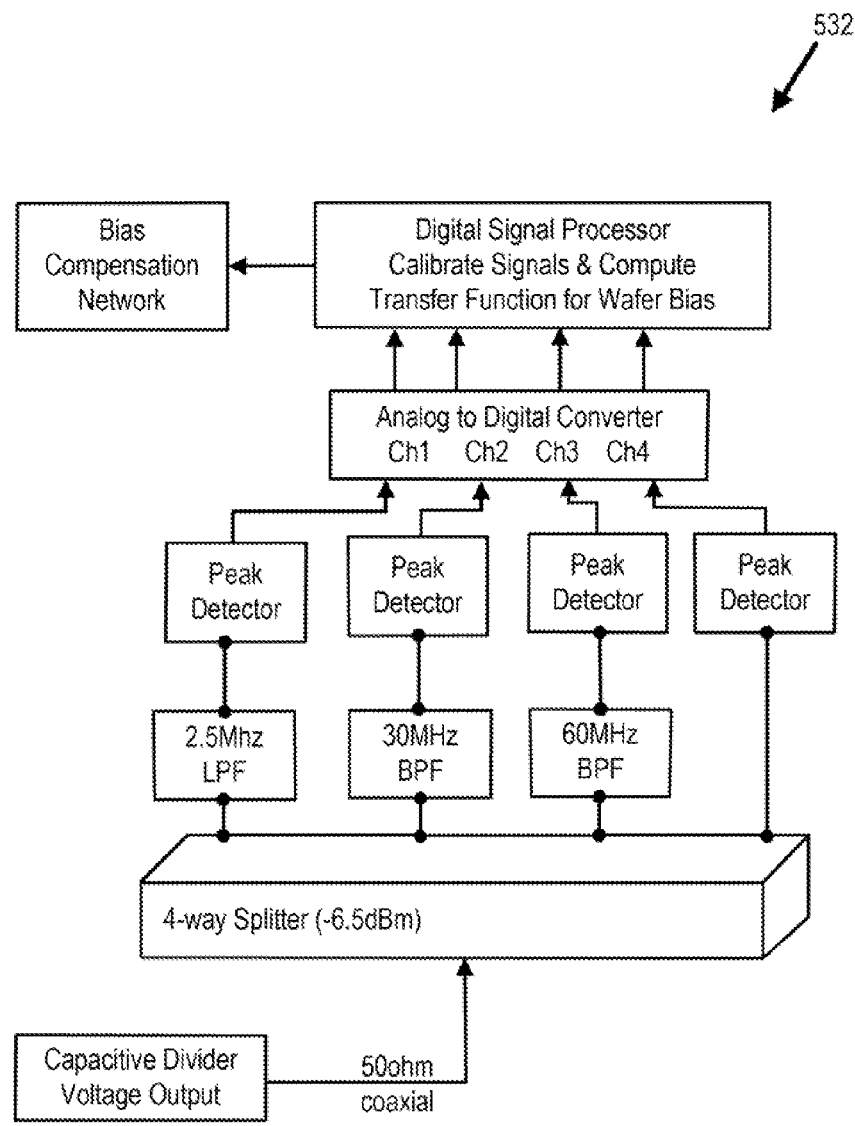
FIG. 5C is an embodiment of an analog RF voltage signal conditioning network with a digital signal processing unit.

The RF voltage signal is then conditioned through a network of analog or digital filters. Figure 5C is an example embodiment of an analog RF signal conditioning network of the type implemented in block 532 of FIG. 5A. At the input of the analog RF voltage signal conditioning network, the signal is split into a number of separate channels (4 in the example of FIG. 5C) to allow for RF filtering of specific RF frequencies responsible for driving the plasma. In this embodiment, the RF generator frequencies are 2 MHz, 27 MHz, and 60 MHz. One channel is not filtered, which maintains the broadband voltage frequency spectrum. In this embodiment the four channels are converted to a DC signal via a passive peak detector [e.g., IN5711 diode], although an active peak detector could be used as well.

The DC signals are then converted to digital signals in order to be processed by the digital signal processor, where the individual signals are calibrated and inputted into the wafer bias transfer function. The output of the transfer function is then fed back to the bias compensation network. It should be noted that the disclosed analog signal conditioning network could be accomplished entirely within the digital domain. In this instance, there would be no need for a signal splitter or analog filters, simply an analog to digital converter (ADC) and a signal processing unit (DSP, FPGA, CPLD or the like), with the signal processing unit responsible for all filtering, peak detection, calibration, and transfer function computation.

In one or more embodiments, the calibration of each voltage channel is performed by applying a gain and offset to each channel. The gain and offset for each channel (2 MHz, 27 MHz, 60 MHz and broadband unfiltered voltages in the example of FIGS. 5A-5C) is determined by the signal response of a given channel and its correlation to the wafer bias. For the filtered channels, this is accomplished by characterizing a given filtered channel response to the wafer bias for that unique single frequency. For instance, the response of the 2 MHz channel would be correlated to the wafer bias for plasma being driven by 2 MHz only and the subsequent gain and offset would be used to calibrate this channel. This is repeated for 27 MHz and 60 MHz. The broadband signal is calibrated by correlating the wafer bias for plasma being driven by all three frequencies and each subsequent variation (2 MHz only, 2 MHz and 27 MHz, 60 MHz only, 27 MHz and 60 MHz, etc. . . . ).

An important factor into the calibration is also the response of the capacitive divider voltage probe 530. The capacitive divider tends to have a unique signal response for each frequency. As a suggested solution, a network analyzer can be used to characterize the response of the capacitive divider voltage sensor, and this response can then used to modify the aforementioned calibration coefficients accordingly. This is an important component in manufacturing accurate and repeatable instruments.

The transfer function for computing wafer bias in composed of four inputs: the calibrated DC voltage signals for 2 MHz, 27 MHz, and 60 MHz as well as the unfiltered broadband signal. The voltage signals are then multiplied by a set of coefficients. Each coefficient is a function of a given frequency mixture driving the plasma. The coefficients are derived through, for example, principal component analysis (PCA) of the matrix consisting of the wafer bias and the four voltage signals (2 MHz, 27 MHz, 60 MHz, and broadband). The individual resultants of the coefficient multiplication are then summed, producing a wafer bias value. Conditional statements and weighting factors can also be used to optimize the coefficients and thus optimize the transfer function result.

Figure 6:
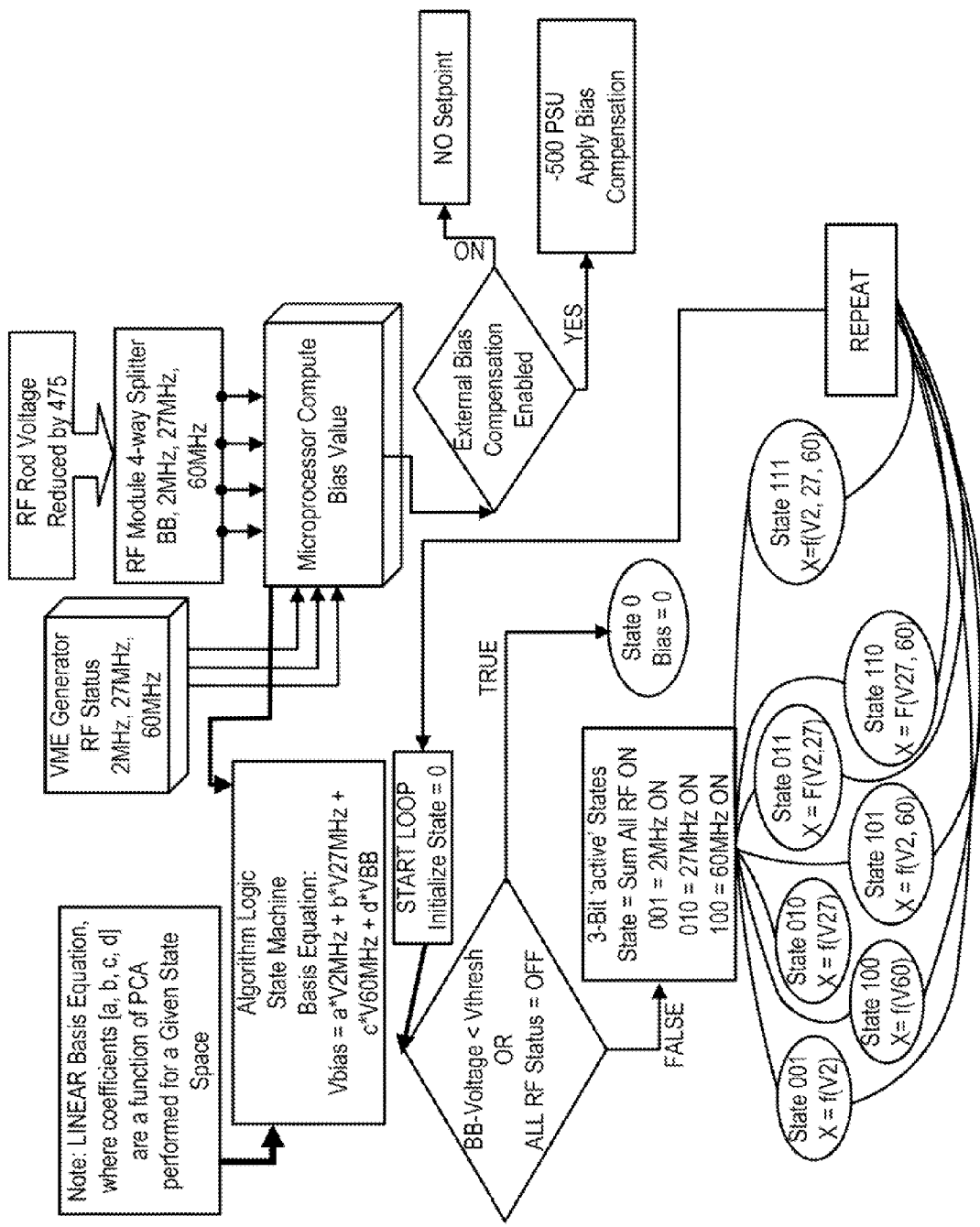
Figure 7:
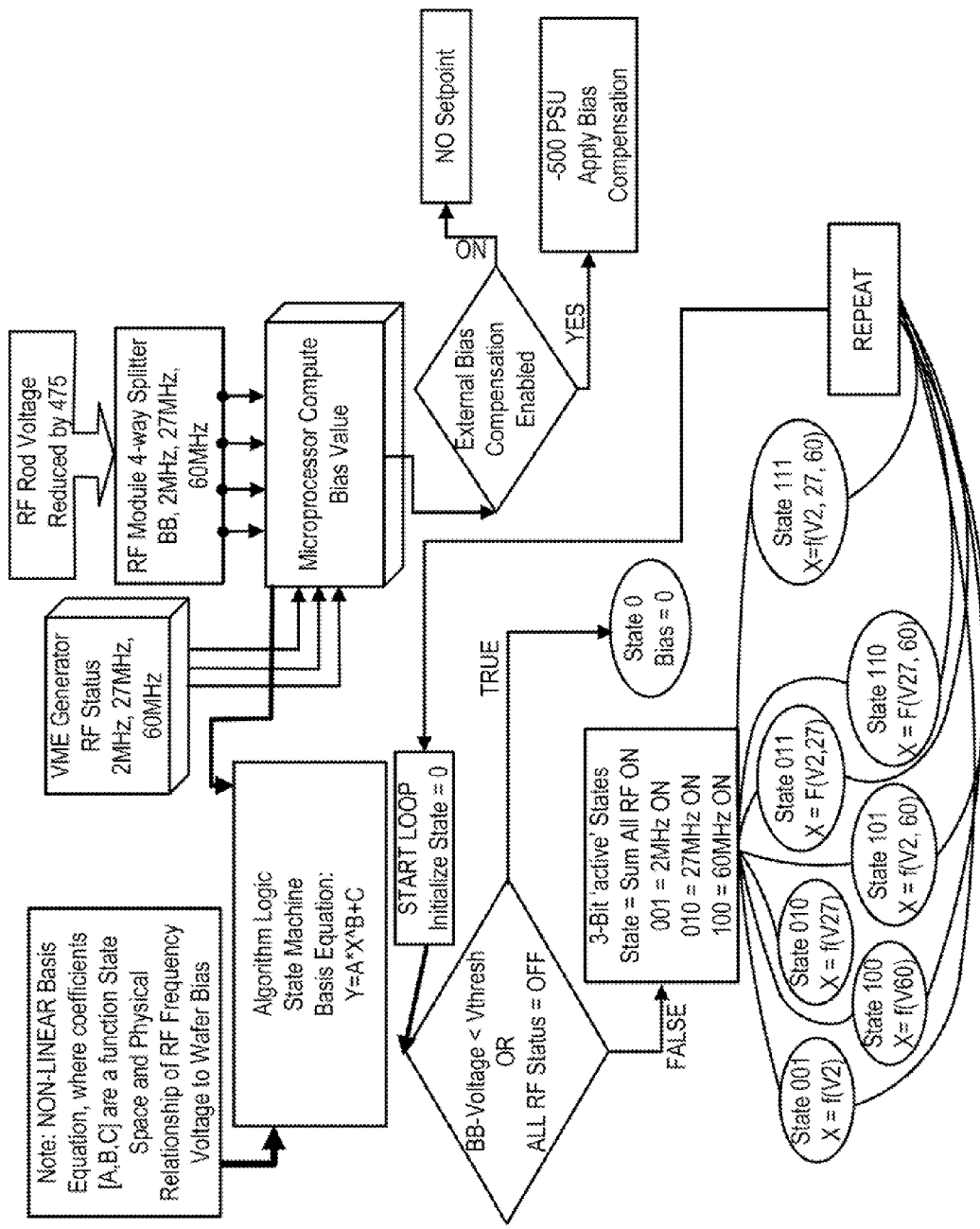

FIGS. 6-10 further discuss the high impedance RF voltage probe for computing wafer potential based on frequency dependent RF voltage signals. In FIG. 6, a linear transfer function is created and the example flowchart illustrates how this linear transfer function may be employed to produce the wafer bias value. FIG. 7 is a flowchart illustrating the use of a non-linear transfer function to produce the wafer bias value. Non-linear transfer functions are believed to be better able to approximate the wafer bias value from the RF voltage in some, if not most, situations. FIGS. 8, 9, and 10 are further explanation of the merits of each approach (linear vs. nonlinear). Both approaches provide a way, in accordance with embodiments of the invention, to correlate the sensed RF voltage to the wafer bias voltage, especially in multi-frequency applications. The wafer bias voltage may then used as a feedback or control signal for the ESC power supply and/or bias compensation network and/or other subsystems in the plasma processing system.

Figure 11:
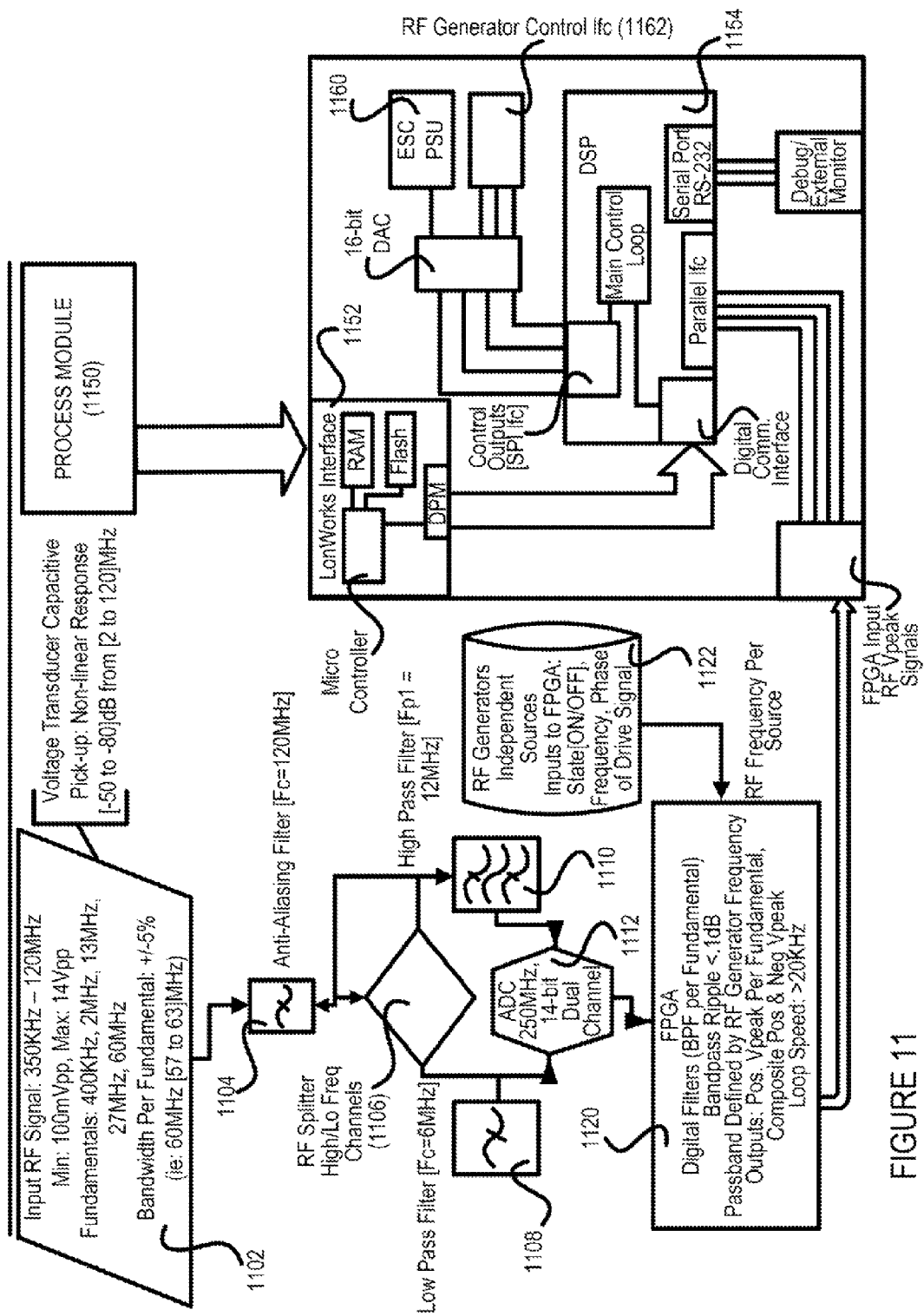
FIG. 11 shows, in accordance with an embodiment of the present invention, a block diagram of an example digital implementation embodiment.

In another embodiment, the ESC RF signal may be processed in the digital domain to improve configurability and to accommodate a wider RF power dynamic range required by demanding processing applications such as some high aspect ratio etches. FIG. 11 shows a block diagram of an example digital implementation embodiment. Input ESC RF signal in block 1102 may be obtained from a capacitive pickup, such as the capacitive divider network 530 of FIG. 5a for example. In the example of FIG. 11, the input RF signal ranges from about 350 KHz to 120 MHz, with fundamental frequencies at about 400 KHz, 2 MHz, 13 MHz, 27 MHz, and 60 MHz although these example values as well as the number of frequencies involved are not limiting of the scope of the invention.

The input RF signal is then filtered using an anti-aliasing low-pass filter 1104 with the filter frequency set at about ½ of the sampling rate of the analog-to-digital converter (ADC) that is employed later to convert the analog input RF signal from block 1102 to a digital signal. In the case of the example of FIG. 11, the ADC sampling rate is 250 MHz and thus the anti-aliasing filter is set at about 120 MHz, which is less than ½ of the ADC sampling rate (for satisfactory signal resolution in accordance with Nyquist's theorem).

The filtered RF signal from anti-aliasing filter 1104 is then split by RF splitter 1106 into two channels (using appropriate low pass and high pass filters) to feed into dual-channel ADC 1112. RF splitting is optional to improve signal resolution and is performed as an optimization to accommodate the use of a dual-channel ADC. However, it is possible to employ a single channel ADC and feed the filtered RF signal from anti-aliasing filter 1104 into the single channel ADC if desired.

Thus, in contrast to the analog approach of FIG. 5c, the analog input RF signal is not required to be split in the analog domain and/or peak-detected in the analog domain. Rather, the RF signal is converted (after appropriate filtering via an anti-aliasing filter) into the digital domain by ADC converter 1112. This improves both configurability and dynamic range response since the limitations of the analog peak detection scheme is not experienced. Specifically, the digital approach overcomes the limitation imposed by the non-linear response of the rectifying diode in the analog peak detection scheme. Another limiting factor of an analog peak detection scheme is that the diode output tends to be a function of the Input Voltage RMS, essentially a power detector. This characteristic further limits the ability of analog detectors to resolve the actual RF Peak Amplitude, rather than an averaged RF Voltage peak as function of the RMS signal. The digital approach sidesteps both of these and other issues.

Digital processing is performed by logic represented in FIG. 11 by a field programmable gate array (FPGA) 1120. FPGA is employed in the instant example partly to take advantage of the PPGA's parallel processing capability on multiple channels although other forms of logic, including microprocessors, microcontrollers, dedicated hardware circuitry, digital signal processors, etc., may also be employed.

One of the improvements relates to the use of RF signals from the RF generators (1122) as independent inputs into the digital processing block 1120. The independently inputted RF signal data, which may include state (on/off), fundamental frequency, and drive signal phase for each RF signal from the RF generators, may be used extract the fundamental tones to tune the digital filters (such as band pass filters) in block 1120. The phase data is particularly useful in resolving modulation effects among ESC RF signals of various frequencies to more accurately compute the voltage at any given frequency.

To elaborate, the phase signal allows for the demodulation of the RF signals that are a function of plasma dynamics (as an active non-linear load). It is common practice to view a plasma chamber as an RE mixer, generating tones as function of the frequency of the RF Source(s) as well as the rates of association/disassociation of gases and the expansion/contraction of the plasma sheaths. By utilizing the phase of the drive signal for each RF generator sourcing and/or biasing the plasma, one can more accurately resolve each fundamental RF tone, even in the most dynamic plasma conditions, such as pulsing of the RF generators.

Alternatively or additionally, the tuning of these digital filters using the fundamental tones extracted from the RF signals from the RF generators enable the construction of very precise and narrowly tailored filters around the fundamental frequencies, which greatly improve the accuracy of the signal resolution by the digital processing block 1120.

The outputs from digital processing block 1120 include the peak voltage (Vpeak) for each fundamental frequency and for the composite broadband signal. Peak detection can be positive peak, negative peak, or both. For the composite signal, negative peak information is particularly useful during the processing phase since there is often an asymmetry in the waveform as a function of the harmonics of each RF source. Therefore, by detecting both the positive and negative peaks, one can resolve a relative metric of the harmonics in the plasma. This harmonic metric can then be used to further optimize wafer bias potential transfer function for a given state space.

As discussed, an advantage of the digital approach is the ease of configurability. For example, when different RF frequencies and/or additional RF frequencies and/or fewer RF frequencies are employed, the hardware does not need to be changed. The digital filters, transfer functions, and other optimizations may be reprogrammed on the same programmable logic, saving a significant amount of time and cost when applications change.

Another aspect of the invention relates to the use of additional plasma chamber parameters to improve the correlation between the ESC RF voltage and the wafer bias potential. These additional chamber parameters include chamber pressure, chamber gap (distance between electrodes), RF delivered power, RF Frequency, RF generator impedance matching network tap positions (capacitor positions of variable LC network), chamber chemistry, chamber topology (i.e.: ground area ratio), wafer type (backside film, substrate film stack), and wafer resistivity. In the present discussion, two specific chamber parameters (pressure and gap distance) are discussed to facilitate understanding although the number and exact parameters may vary depending on applications.

In another aspect of the invention, the inventor herein notes that there is a noticeable change in correlation (e.g., gain in the slope of the trend line) between RF voltage and wafer bias voltage when different chamber pressures are involved. By taking chamber pressure into account, more accurate on-the-fly determination of wafer bias voltage may be obtained from the ESC RF voltage. The compensating function or equation or scaling factor may be determined empirically in a research setting (e.g., by mapping the RF voltage versus the wafer bias voltage at different chamber pressures and determine the correlation change) for later use in a production setting, for example. In an embodiment, the chamber pressure information may be employed as a scaling factor to scale the pressure-agnostic transfer function output. Additionally or alternatively, the chamber pressure may be employed as another input into the transfer function to obtain a pressure-specific output for a given input into the transfer function.

In another aspect of the invention, the inventor herein notes that there is a noticeable change in correlation (e.g., gain in the slope of the trend line) between ESC RF voltage and wafer bias voltage when different chamber gaps between the upper and lower electrodes are involved. By taking electrode gap data into account, more accurate on-the-fly determination of wafer bias voltage may be obtained from the ESC RF voltage. The compensating function or equation or scaling factor may be determined empirically in a research setting (e.g., by mapping the RF voltage versus the wafer bias voltage at different chamber gaps and determine the correlation change) for later use in a production setting, for example. In an embodiment, the chamber gap information may be employed as a scaling factor to scale the pressure-agnostic transfer function output. Additionally or alternatively, the chamber gap may be employed as another input into the transfer function to obtain a pressure-specific output for a given input into the transfer function. This optimization using chamber gap information may be employed alternatively or additionally in conjunction with the use of the chamber pressure information. Similar considerations apply to other chamber data if they are employed for further optimization of the transfer function.

Referring back to FIG. 11, the additional chamber data may be received from process module 1150 via an appropriate communication interface 1152. In the example of FIG. 11, the actual application of the transfer function and the optimization using the chamber data are performed in DSP block 1154 using the peak voltage (positive and negative) information received from block 1120 and the chamber data information received from block 1150. However, it is also possible to perform such transfer function application and optimization in block 1120, in which case block 1120 would obtain the chamber data directly from process module 1150 for example. The output of DSP block 1154 represents the computed wafer potential and is converted back to the analog domain via DAC 1156 to serve as a feedback or control signal to ESC power supply unit 1160 and/or RF generator 1162. For example, with the increased accuracy & precision of the computed wafer bias potential (computed as a function of the RF voltage as disclosed herein), one can use this computed value as a control signal for the RF generator delivered power in order to maintain a desired wafer potential for a given wafer process step.

Note that it is possible to perform analog splitting and peak detection (per FIG. 5c) and apply the additional optimization using additional chamber parameters in the manner discussed to obtain the computed wafer bias potential. Alternatively, the input RF signal may be converted directly into the digital domain as discussed in connection with FIG. 11 and then processed and optimized in the digital domain to obtain the computed wafer bias potential.

By processing the ESC RF signal in the digital domain and/or employing independently inputted RF generator signals and/or employing additional chamber parameters for correlation optimization, embodiments of the invention enable a more accurate computed wafer bias voltage to be obtained from the ESC RF voltage. The more accurately obtained wafer bias voltage in turn improves the ability to monitor the plasma health, to detect undesirable plasma conditions such as plasma unconfinement, etc.

While this invention has been described in terms of several preferred embodiments, there are alterations, permutations, and equivalents, which fall within the scope of this invention. For example, although the RF voltage employed to compute the wafer bias potential is disclosed herein to be one taken from the ESC or the ESC base plate or from another component of the ESC assembly or near the vicinity of the ESC, the RF voltage may in fact be measured at any point in the RF delivery path and employed for wafer bias calculation purposes. Accordingly, the term "RF voltage" and "ESC RF voltage" and "ESC RF signal" and the like should not be construed to be limiting by their terminology usage in the examples. It should also be noted that there are many alternative ways of implementing the methods and apparatuses of the present invention. Although various examples are provided herein, it is intended that these examples be illustrative and not limiting with respect to the invention.

What is claimed is:

1. A method for controlling a plasma processing system including a plasma processing chamber, comprising:
   receiving an RE signal from at least one component of said plasma processing chamber;
   processing said RE signal in a digital domain to obtain peak voltage information for each fundamental frequency and a broadband frequency of said RE signal; and
   deriving wafer bias information from said peak voltage information, wherein said wafer bias information is employed as one of a feedback and a control signal for said controlling said plasma processing system.

2. A method for controlling a plasma processing system including a plasma processing chamber, comprising:
   receiving an RE signal from at least one component of said plasma processing chamber;
   processing said RE signal to obtain peak voltage information for each fundamental frequency and a broadband frequency of said RE signal; and
   deriving wafer bias information from said peak voltage information, wherein said deriving includes using at least one plasma processing chamber parameter in said deriving and wherein said wafer bias information is employed as one of a feedback and a control signal for said controlling said plasma processing system.

3. The method of claim 1, wherein said processing of said RF signal obtains a plurality of signals, said plurality of signals including at least individual signals corresponding to individual ones of multiple RF frequencies.

4. The method of claim 1 wherein said RF signal is inputted into a transfer function, and providing an output of said transfer function as a control signal to control a subsystem of said plasma processing system.

5. The method of claim 4 wherein said transfer function represents a linear transfer function.

6. The method of claim 5 wherein said linear transfer function is obtained using multi-variable analysis.

7. The method of claim 6 wherein said transfer function represents a non-linear transfer function.

8. The method of claim 5 wherein said RF signal is filtered using an anti-aliasing filter.

9. The method of claim 8 wherein said filtered RF of signal from said anti-aliasing filter is split into two channels to feed into a dual-channel analog/digital converter.

10. The method of claim 1 wherein said processing in the digital domain is performed by a field programmable gate array (FPGA).

11. The method of claim 1 wherein said deriving includes using at least one plasma processing chamber parameter.

12. The method of claim 11 wherein said at least one plasma processing chamber parameter includes chamber pressure, chamber gap distance between electrodes, RF delivered power, RF frequency, RF generator impedance matching network tap positions having capacitor positions of variable LC network, chamber Chemistry, chamber topology including a around area ratio, wafer type, and water resistivity.

13. The method of claim 12 wherein said chamber pressure is taken into account for providing enhanced accurate on-the-fly determination of wafer bias voltage.

14. The method of claim 1 wherein said control signal controls an RF generator.

15. The method of claim 2 wherein said at least one plasma processing chamber parameter includes chamber pressure, chamber gap distance between electrodes, RF delivered power, RF frequency, RF generator impedance matching network tap positions having capacitor positions of variable LC network, chamber chemistry, chamber topology including a ground area ratio, wafer type, and wafer resistivity.

16. The method of claim 15 wherein said chamber pressure is taken into account for providing enhanced accurate on-the-fly determination of wafer bias voltage.

17. The method of claim 16 wherein said control signal controls an RF generator.

18. The method of claim 17 wherein said processing of said RF signal obtains a plurality of signals, said plurality of signals including at least individual signals corresponding to individual ones of multiple RF frequencies.

19. The method of claim 18 wherein said RF signal is inputted into a transfer function, and providing an output of said transfer function as a control signal to control a subsystem of said plasma processing system.

20. The method of claim 19 Wherein said RF signal is filtered using an anti-aliasing filter.

* * * * *